United States Patent
Sunter

(10) Patent No.: US 6,717,415 B2
(45) Date of Patent: Apr. 6, 2004

(54) CIRCUIT AND METHOD FOR DETERMINING THE LOCATION OF DEFECT IN A CIRCUIT

(75) Inventor: Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 10/162,916

(22) Filed: Jun. 6, 2002

(65) Prior Publication Data

US 2003/0146763 A1 Aug. 7, 2003

Related U.S. Application Data

(60) Provisional application No. 60/353,961, filed on Feb. 5, 2002.

(51) Int. Cl.[7] .......................... G01R 31/08; G01R 31/28
(52) U.S. Cl. ........................................ 324/519; 714/727
(58) Field of Search ................. 324/527, 519, 324/537, 765, 534, 543, 528, 538; 714/727

(56) References Cited

U.S. PATENT DOCUMENTS

| 5,159,276 A | * | 10/1992 | Reddy, III | ................. | 324/678 |
| 5,254,953 A | | 10/1993 | Crook et al. | ................. | 324/538 |
| 5,391,993 A | * | 2/1995 | Khazam et al. | ............. | 324/684 |
| 5,736,862 A | | 4/1998 | Hamblin | ..................... | 324/527 |
| 6,104,198 A | | 8/2000 | Brooks | ........................ | 324/538 |
| 6,297,643 B2 | * | 10/2001 | De Jong et al. | ............ | 324/537 |

OTHER PUBLICATIONS

Parker et al., Design, Fabrications and Use of Mixed–Signal IC Testability Structures, 1997 International Test Conference Proceedings, Nov. 1–6, 1997, pp. 489–498, Paper 21.1.
Tegethoff et al., "Opens Board Test Coverage: When Is 99% Really 40%?", 1996 International Test Conference, Oct. 20–25, 1996, pp. 333–339, Paper 12.2.
Sunter et al., "A General Purpose 1149.4 IC with HF Analog Test Capabilities"; 2001 International Test Conference Proceedings, Oct. 30–Nov. 1, 2001, pp. 39–45 Paper 2.2.

* cited by examiner

Primary Examiner—Albert Decady
Assistant Examiner—James Kerveros
(74) Attorney, Agent, or Firm—Eugene E. Proulx

(57) ABSTRACT

A method for testing an integrated circuit (IC) for open defects in a printed wire connected to an IC pin of the IC, the method includes measuring the capacitance of the IC pin; comparing the value of the measured capacitance to an expected IC pin capacitance value for the pin unconnected, and determining that an open defect exists proximate the pin when the measured capacitance is less than a predetermined value based on the expected IC pin capacitance value.

5 Claims, 5 Drawing Sheets

CIRCUIT AND METHOD FOR DETERMINING THE LOCATION OF DEFECT IN A CIRCUIT

REFERENCE TO RELATED APPLICATIONS

This application claims the benefit of Provisional Application Ser. No. 60/353,961 filed Feb. 5, 2002.

BACKGROUND OF THE INVENTION

1. Field of the Invention

The present invention generally relates to testing of printed circuit boards, or substrates, on which are mounted integrated circuits (ICs), and, more specifically, to a method and circuit for determining the location of an unintended break in a printed wire connecting two IC pins to simplify repair of the circuit board or substrate.

2. Description of Related Art

As printed circuit boards populated with ICs get smaller and more dense, it becomes more difficult to quickly diagnose and repair the boards, especially if the IC package is a ball grid array (BGA). On their underside, BGAs have an array of solder pads that are completely hidden from view when the pads are soldered to a board, as shown in FIG. 1 and in profile in FIG. 2, and therefore it is difficult to visually verify the soldered connections. As a result, digital boundary scan is becoming a popular design for test (DFT) technique to permit quick verification of board-level connections between ICs.

A digital boundary scan test comprises enabling a serial shift register that accesses the pins of an IC, shifting in logic values to each output pin, updating the logic value at each output pin with the value shifted in, parallel capturing the logic values received at each input pin, and serially shifting out the captured values for examination by a tester.

When a short circuit is detected between two signals, it is usually easy to predict the physical location of the defect because there is typically only one location where a pair of signals is close to one another and near a soldered connection. However, when an open is detected in a wire connecting an output pin and an intended input pin, it can be difficult to locate the position of the defect because no other signals are involved. For a board that was inspected before it was populated with components, the most likely location for an open in a connection between two IC pins is the solder connection to one of the two pins involved.

Diagnosing the location of opens and shorts in populated circuit boards is important for allowing quick repair of the boards, specifically for facilitating the re-soldering of only the defective pin or array of pins. There are several prior art techniques for determining the location of these defects.

Crook et al. U.S. Pat. No. 5,254,953 granted on Oct. 19, 1993 for "Identification of Pin-Open Faults by Capacitive Coupling Through the Integrated Circuit Package", applies a 10 kHz signal via a metal plate that has the same area as an IC whose pins are to be tested for open circuit faults. The metal plate is physically placed a short distance (within a few millimeters) above the IC and hence capacitively couples to the pins (leadframe legs) of the IC package. The signal is received via a mechanical probe that probes the printed wire that is supposed to be connected to a pin of the IC. The signal amplitude detected by the sensor is larger if the pin is connected to the probed wire than if there is an open solder joint. This approach is not suitable for BGAs because the IC pins are underneath the IC die and hence have much less capacitance to the metal plate, there is no leadframe, the pins have much less area than non-BGA ICs, and many wires are not accessible to be probed.

Hamblin U.S. Pat. No. 5,736,862 granted on Apr. 7, 1998 for "System for Detecting Faults in Connections Between Integrated Circuit Board Traces", applies a stimulus signal to another pin of one of the ICs whose pin is to be tested for an open circuit, and the signal is detected via a mechanical probe that is placed on a mid-point of the wire under test. The stimulus signal is capacitively coupled between the pin to which it is applied and the pin that is supposed to be connected to the wire under test, through inherent capacitance that typically exists between any two pins of any IC. This approach does not require access to the pins under test, but does require precision in the placement of the mechanical probes and probe access to every wire to be diagnosed.

Brooks U.S. Pat. No. 6,104,198 granted on Aug. 15, 2000 for "Testing the Integrity of An Electrical Connection to a Device Using an Onboard Controllable Signal Source", generates a stimulus signal within a first IC and the stimulus signal is detected via a capacitively-coupled sensor plate placed above a second IC whose pin is supposed to be connected to a pin of the first IC. This approach addresses the problem of inaccessibility of IC pins, but still requires a sensor plate that must be precisely placed physically close to the circuit board. For many populated circuit boards, it is not practical to place a sensor plate close enough to the component side of the circuit board, and often ground plane layers within the circuit board, such as shown in FIG. 2, prevent meaningful measurements when the sensor plate is on the other side of the circuit board.

A paper entitled "Opens Board Test Coverage: When is 99% Really 40%?", by M. Tegethoff et al, published in the Proceedings of the 1996 International Test Conference (ITC), describes detecting open circuits in printed circuit boards containing ICs by using X-ray laminography. This equipment uses X-rays to identify open circuits between BGA pins and printed wires underneath. The equipment is quite expensive (more than $100K), large, and relatively slow.

A booklet entitled "IEEE Standard for a Mixed Signal Test Bus", published in 1999 by the Institute for Electrical and Electronic Engineers (IEEE), which is also known as IEEE STD. 1149.4-1999, or simply 1149.4, describes the general architecture of a mixed signal test bus. The architecture is shown in FIG. 4. The capabilities of this test bus have been described in several published papers, including, "Design, Fabrication, and Use of Mixed-Signal IC Testability Structures" by K. Parker et al, published in the Proceedings of the 1997 ITC. This test bus was primarily designed to permit the measurement of discrete passive components, including capacitors and resistors, that are connected to the pins of ICs which might otherwise be inaccessible due to the density of the circuit boards containing these ICs and components. It is possible to apply a stimulus to a pin, via one of these test buses, and to simultaneously monitor the pin's response voltage via another of these test buses, and to thus determine the capacitance of a discrete capacitor that has been connected to the pin, such as that shown in FIG. 3. The published papers regarding 1149.4 anticipate that if the value of a capacitor is measured to be approximately zero, it can be deduced that the capacitor is missing or some other open circuit defect exists, but it is not taught by the prior art how to deduce where the open defect in the circuit physically exists.

Thus, there is a need for a method which determines the physical location of open circuit defects in wires connected to IC pins using only wire access to a circuit board and to do so using only low cost, commonly available electronic test equipment, without requiring mechanical probes, plates, or other such precision electro-mechanical equipment, so that the diagnosis can be performed at a field repair office as well as at an initial manufacturing site.

SUMMARY OF THE INVENTION

The present invention provides a method and a circuit for determining the location of an open defect in a wire connected to an IC pin by providing digitally controlled electrical access to the IC pin via a function or test bus connected to the IC, a stimulus signal within or external to the IC, signal detection circuitry within or external to the IC, and means for comparing a measured capacitance of the pin to the value expected for the pin without a connection. The method includes the steps of applying a stimulus signal to the pin connected to the wire via the digitally controlled electrical access, detecting the resultant signal at the pin via the digitally controlled electrical access, comparing the detected value to an expected value that is based on the capacitance of the pin and the expected capacitance per unit length of the wire.

When a wire connects two IC pins, the inventive method further includes simply determining which pin the open defect is closer to, based on which pin has less wire capacitance.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

A primary objective of the invention is to facilitate finding the location of an open defect in a wire connected to an IC pin by providing access to the pin so that the total capacitance at the pin can be deduced and compared to an expected value.

Figure 1:
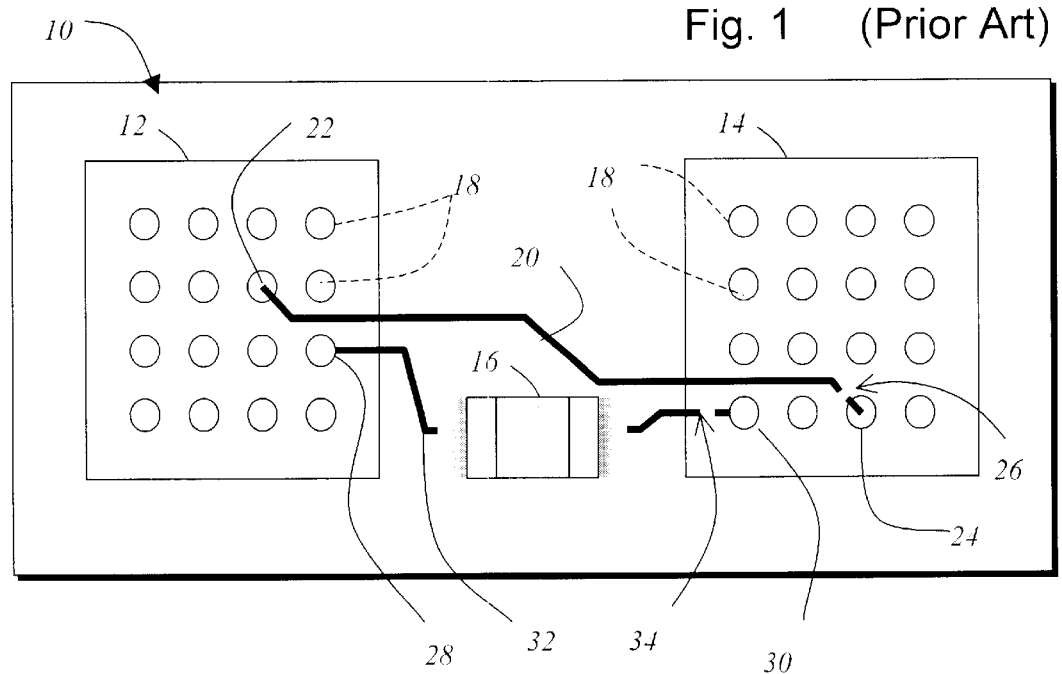
FIG. 1 is a side view of a printed circuit board containing two BGA ICs, a capacitor, and printed wires.
Figure 2:
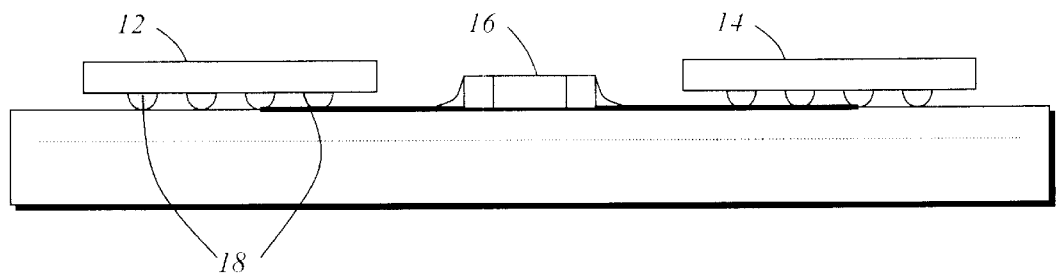
FIG. 2 is a top view of the printed circuit board of FIG. 1.
Figure 3:
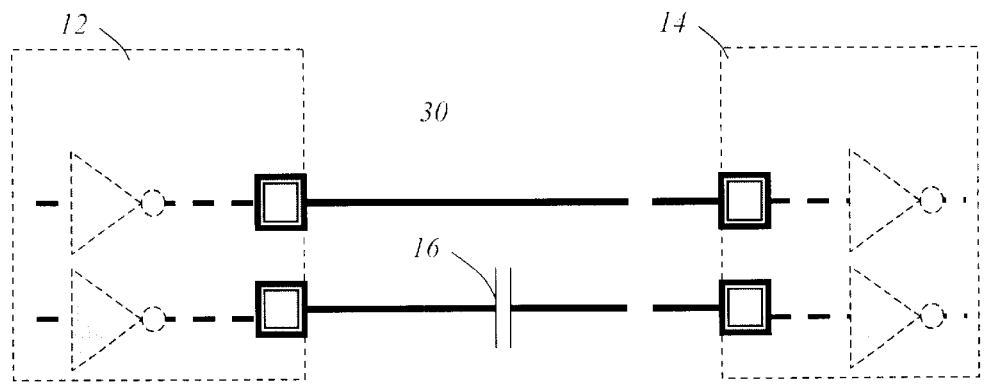
FIG. 3 is a schematic of part of the circuit of FIG. 1 and FIG. 2.

FIG. 1 and FIG. 2 illustrate the problem and show IC packages 12 and 14 in the form of BGAs. On the underside of the packages, BGAs have an array of solder pads 18 that are completely hidden from view when the pads are soldered to a board, circuit board or substrate 10. FIG. 1 shows a wire 20 extending from an IC pin 22 on IC 12 to an IC pin 24 on IC 14 and having an open defect at 26. The figure also shows a capacitor 16 connected between an IC pin 28 on IC 12 and an IC pin 30 on IC 14 by a wire 32 which has an open defect at 34.

The typical capacitance, to ground, of an IC pin in a package is between 2 and 8 picofarads (pF), mostly depending on the package type. The typical capacitance, to ground, of a printed wire is between 0.3 and 1.5 pF per centimeter (cm), mostly depending on the printed circuit board technology. For the following example, assume that the printed wire capacitance is 1 pF/cm, the IC pin capacitance is 3 pF, and a 3 cm printed wire is intended to be connected to the IC pin. If an open defect exists at the pin, the capacitance at the pin will be 3 pF. If no defect exists, the capacitance at the pin will be 6 pF.

Commonly available inductance-capacitance-resistance (LCR) meters costing less than $5,000, such as Agilent Technologies LCR Meter 4263B, can easily measure this difference in capacitance. If the wire is also connected to another pin of an IC or component, then the capacitance of the wire and its connected pins will be higher and hence it will be easier to differentiate where the open defect is.

Figure 4:
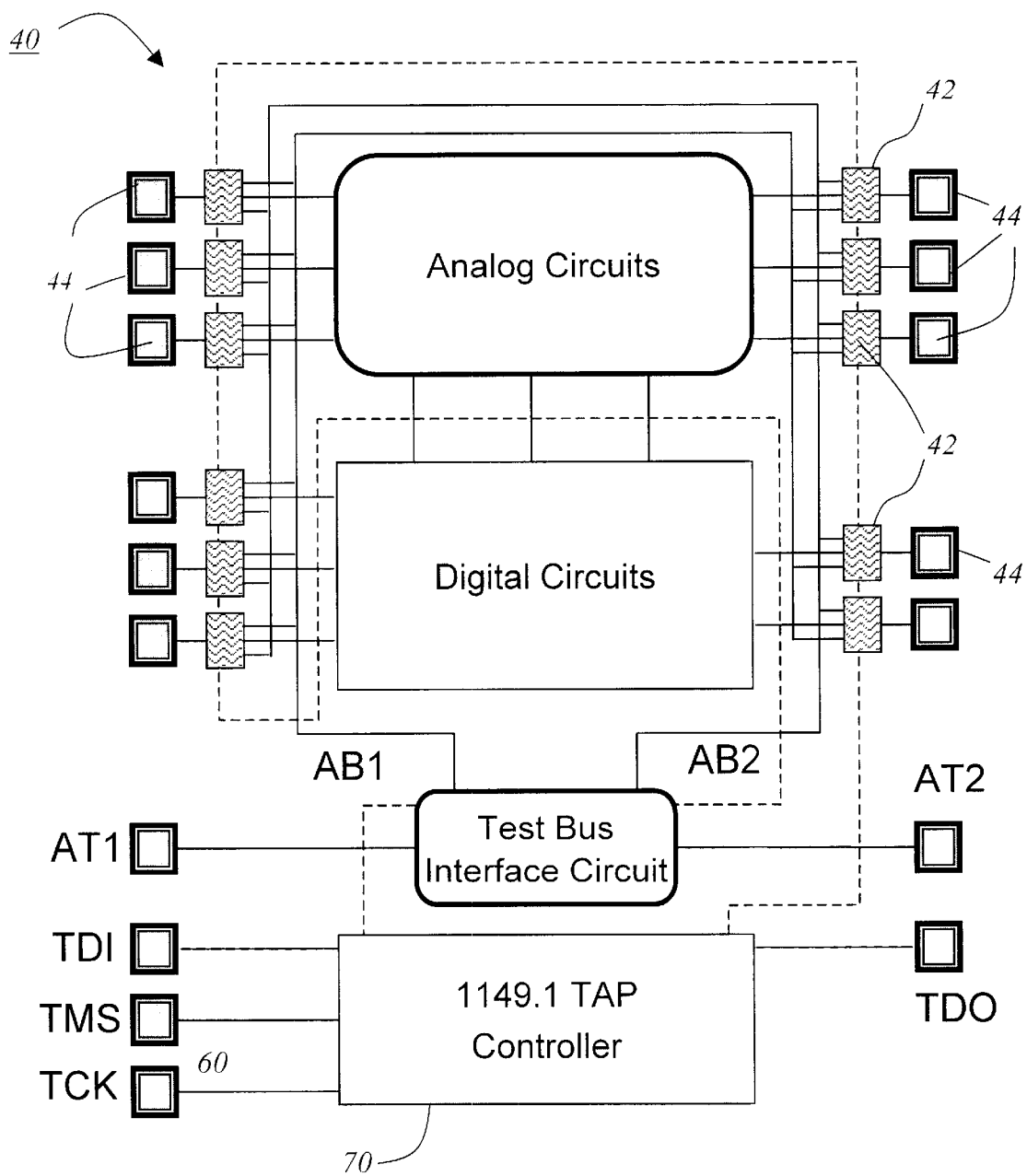
FIG. 4 is a circuit block diagram of an 1149.4 analog bus on an IC.

Referring to FIG. 4, as previously mentioned, 1149.4 defines an analog bus arrangement that connects, within each IC 40, to the pins 44 of that IC and permits an analog stimulus current to be conveyed to each pin on one bus, such as AB1, and the analog response voltage to be conveyed from each pin along another bus, such as AB2. Electrical connection of each pin to each analog bus is enabled by logic bits loaded into a boundary scan shift register comprised of a plurality of boundary scan cells 42. Each on-chip analog bus AB1 and AB2 is also connected to an analog bus pin, AT1 or AT2, of the IC so that the stimulus signal can be supplied from a signal source external to the ICs and the response voltage can be measured by equipment external to the ICs.

The present invention provides a method for testing an integrated circuit (IC) for open defects in a printed wire connected to an IC pin of the IC, the method comprising measuring the capacitance of the IC pin; comparing the value of the measured capacitance to an expected IC pin capacitance value; and determining that an open defect exists proximate the pin when the measured capacitance value is closer to the expected value of the pin alone than to the expected sum of the pin capacitance plus wire capacitance. A variety of techniques can be used to determine the capacitance of an IC's pin, and three will be described next.

Figure 5:
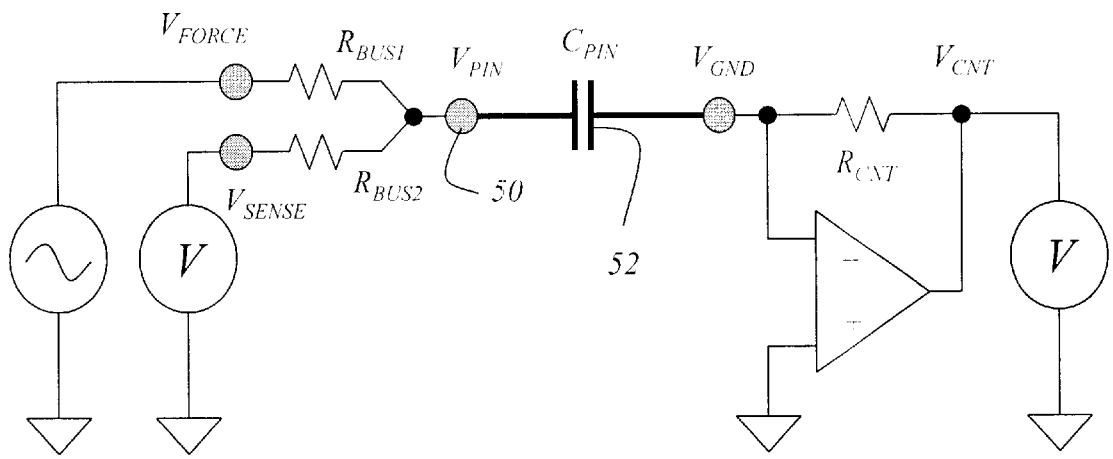
FIG. 5 is a circuit diagram of capacitance measurement using the auto balancing bridge method.

One prior art technique for measuring a capacitance $C_{PIN}$ is shown in FIG. 5. A sinusoidal signal is applied to the pin 50 via a first path having unknown resistance $R_{BUS1}$. The sinusoidal response voltage at the pin is monitored via a second path having unknown resistance $R_{BUS2}$. The stimulus current through the capacitance 52 is converted by an operational amplifier 54 and a known resistance $R_{CNT}$ into a voltage $V_{CNT}$. The amplitude and phase delay of the response voltage relative to the stimulus current are used to calculate the pin's capacitance. A stimulus signal voltage having a frequency of 10 kHz and an amplitude of 0.2 volt (as used in aforementioned U.S. Pat. No. 5,254,953) is adequate to measure capacitances lower than 10 pF with better than 10% accuracy. The response is evaluated for an exact integer number of stimulus sinusoidal cycles to reduce the impact of noise and offset voltage on the measured result.

Figure 6:
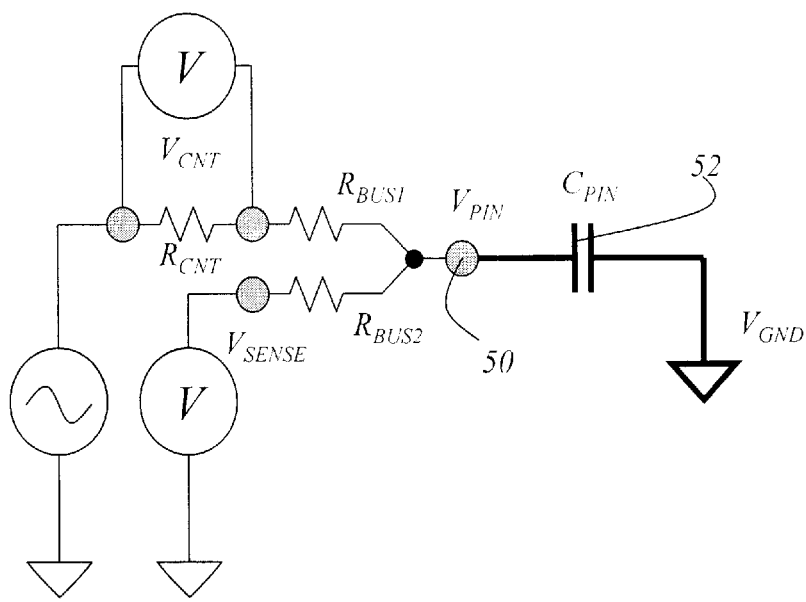
FIG. 6 is a circuit diagram of capacitance measurement using the I–V method.

A similar prior art technique for measuring capacitance $C_{PIN}$ is shown in FIG. 6. The sinusoidal signal is applied to pin 50 via a first path having unknown resistance $R_{BUS1}$. The sinusoidal response voltage at the pin is monitored via a second path having unknown resistance $R_{BUS2}$. The stimulus current through capacitance 52 is converted into a voltage by known resistance $R_{CNT}$. The amplitude and phase delay of the response voltage relative to the stimulus current are used to calculate the pin's capacitance.

Figure 7:
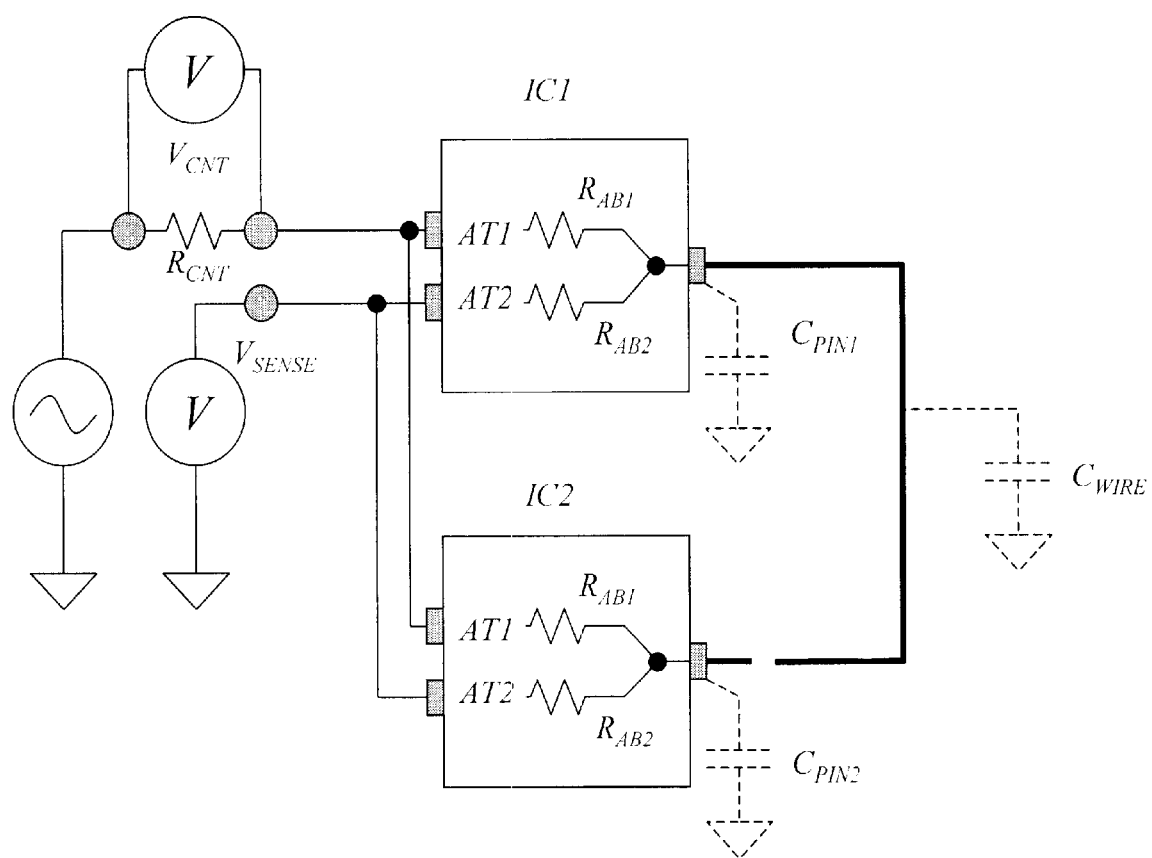
FIG. 7 is a circuit diagram of capacitance measurement using the I–V method and the 1149.4 analog bus, including a wire with an open defect.

Either of the preceding two prior art techniques can be used to measure an IC pin capacitance according to the method of the present invention. In each case, the first and second paths can be analog buses, such as the analog buses, described above and specified by the 1149.4 standard and shown in FIG. 7. The ground voltage, $V_{GND}$, is the voltage at a ground plane (underlying the capacitance) of the circuit board. According to 1149.4, boundary scan cells in the IC can enable switches that provide access from each of the two analog buses to a selected pin, or to no pin. To determine the capacitance at a pin, the capacitance, $C_{BUS}$, of the access buses is first measured, via chip access pins, AT1 and AT2, while no pins are accessed. Then, the switches that access the selected pin are enabled by loading appropriate enabling bits into the pin's boundary scan cell and the capacitance is measured again via access pins AT1 and AT2. This measured capacitance, after subtracting the effects of $C_{BUS}$, is equal to the capacitance, $C_{PIN}$, of the selected pin. Then, the measured capacitance value, $C_{PIN}$, may be compared to the capacitance expected for the pin if it were unconnected, to deduce whether a wire is connected to the pin or how much wire is connected to the pin.

The sinusoidal stimulus signal in the techniques described in the preceding paragraphs could instead be a DC current. A constant (DC) current can be applied to the pin via one analog bus and the ramp response voltage at the pin can be monitored via a second bus. The time at which the ramp crosses a predetermined voltage can be used to calculate the pin's capacitance. The time is proportional to the capacitance of the pin. A stimulus current of 10 microamperes ($\mu$A) is adequate to measure 5 pF pin capacitance with 10% accuracy. A 5 $\mu$A current will cause the voltage across a 5 pF capacitance to increase linearly at V/t=i/C=5 $\mu$A/5 pF=106 volts per second=1 volt per microsecond. If the access bus capacitance is 100 pF, the ramp rate for the bus alone will be 1 volt per 20 $\mu$s, and, when the bus is connected to the pin, the ramp rate will be 1 volt per 21 $\mu$s. With a 10 MHz sampling clock, the voltage across the 5 pF pin capacitance can be sampled once every 0.1 $\mu$s to permit 10% accuracy.

The stimulus current can be generated by test equipment off-chip, or within another IC on the circuit board, or within the IC whose pin capacitance is being tested. Similarly, the response voltage can be monitored by test equipment off-chip, or within another IC on the circuit board, or within the IC whose pin capacitance is being tested. For example, the stimulus current could be generated within each IC by a constant current source, and the voltage could be monitored by a logic gate whose logic state changes when the pin voltage exceeds the input switching point voltage of the logic gate.

Figure 8:
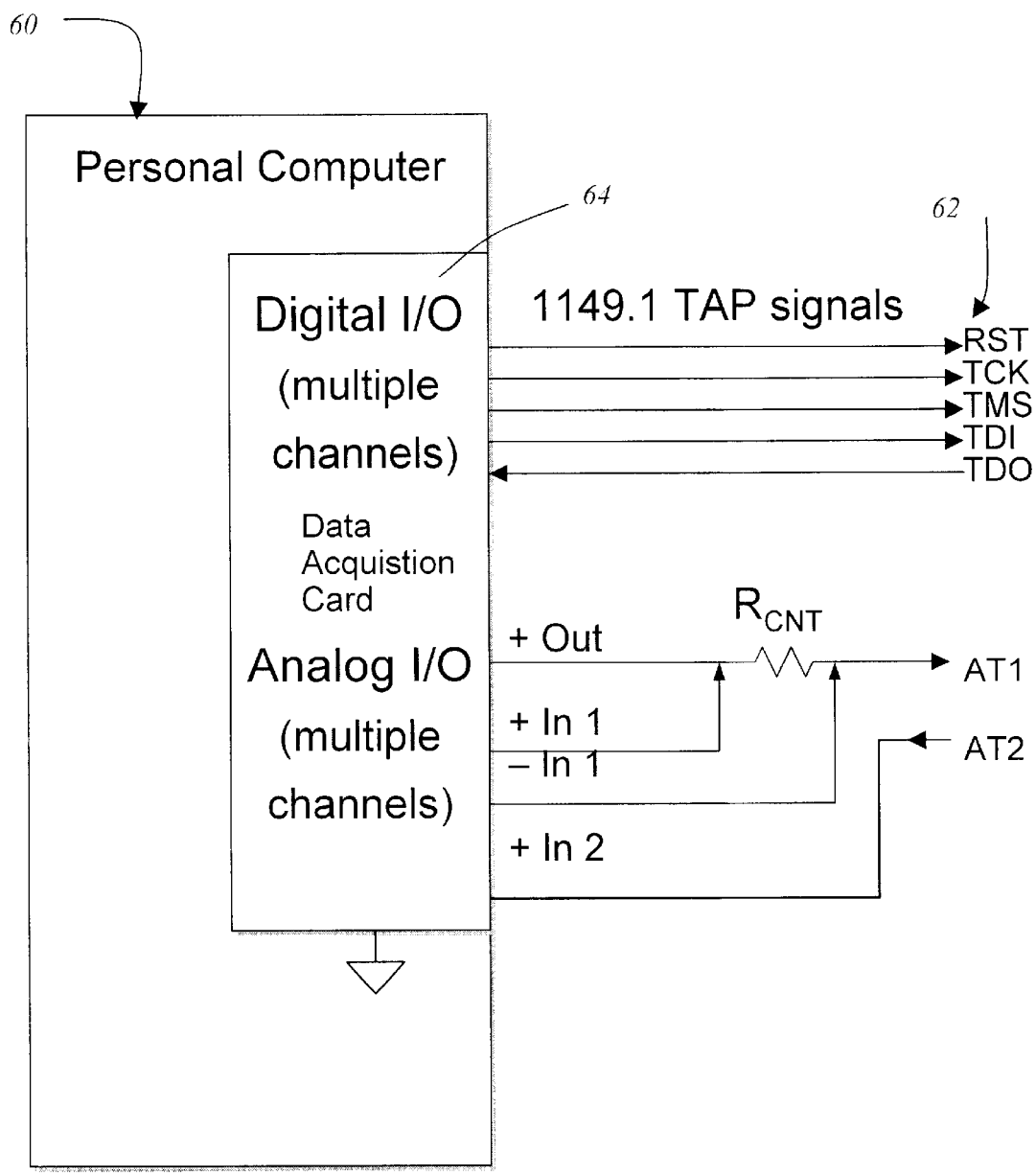
FIG. 8 diagrammatically illustrates external equipment in the form of a personal computer equipped with a data acquisition unit that generates a stimulus voltage using a digital-to-analog converter, samples an analog response voltage using an analog-to-digital converter, and drives and monitors 1149.4 test access port digital signals.

A printed circuit board may contain many ICs, each connected to two common analog buses as defined by 1149.4. For such an arrangement, the stimulus can be supplied from, and a response can be conveyed to, test equipment external to the board. The external test equipment could be an LCR meter as previously mentioned. Alternatively, the external equipment could be, for example, a personal computer 60 (FIG. 8) equipped with a data acquisition unit 64 that generates the (analog) stimulus voltage using a digital to analog converter (DAC), samples the analog response voltage using an analog-to-digital converter (ADC), and has five or more digital I/O pins, generally indicated by reference numeral 62, to drive and monitor the 1149.4 test access port (TAP) 70 (FIG. 2) digital signals. Such data acquisition units are available commercially from several vendors for less than $1,000, and are also available in PCMCIA card format so that it can be inserted into a lap-top computer. A resistor, $R_{CNT}$, can be connected in series with the DAC output so that its output current can be monitored by one of the input channels of the ADC, as shown in FIG. 8. A similar low cost mixed-signal board tester scheme was shown in a paper entitled, "A General Purpose 1149.4 IC with HF Analog Test Capabilities" by S. Sunter, and published in the International Test Conference Proceedings, October 2001.

When testing circuit boards in a field office, board test conditions are usually not as controlled and electrically quiet as in a high volume manufacturing test site. In this case, significant measurement noise can often be traced to electromagnetic interference from the mains power line frequency, which is 60 Hz in the USA and other countries, and 50 Hz in many other countries. In the prior art, it is known that one way to greatly reduce the impact of these frequencies when measuring very small signals is to choose a stimulus frequency that is an exact multiple of the mains power line frequency. For example, when testing a circuit board in the USA, instead of using 10 kHz as the stimulus frequency, 10.020 kHz should be used because it is an exact multiple of 60 Hz. For the present invention, it is preferable to use a stimulus frequency chosen in this way.

The 1149.4 standard defines a TAP that has 4 or 5 pins dedicated to test access. It also permits these pins to be switched between test and non-test functions using a "compliance-enable" pin. However, it is possible to maintain control of test functions via the TAP controller when the TAP pins are in non-test mode. A function-mode data bus can be used to send data directly to the TAP controller within the IC, bypassing the TAP pins completely. The present invention anticipates this type of access, so that the number of pins dedicated to providing test access for measuring pin capacitances can be minimized. Also, the two analog buses could be entirely within each IC, without the dedicated analog test pins AT1 and AT2 (however this arrangement would not be compliant with the 1149.4 standard).

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

I claim:

1. A method for testing an integrated circuit (IC) for open defects in a printed wire connected to an IC pin of the IC, said IC having a boundary scan cell associated with each pin of the IC, analog test access buses connected to the boundary scan cells and test bus access pins for accessing said buses, the method comprising:

measuring the capacitance between the IC pin and ground;

comparing the value of the measured capacitance to an expected IC pin capacitance value between the pin and ground with the pin unconnected, and determining that an open defect exists proximate the pin when the measured capacitance is less than a predetermined value based on said expected IC pin capacitance;

said measuring the capacitance of the IC pin including:
measuring the capacitance of the access buses via the test bus access pins on said IC while no pins are accessed;
enabling switches that access a selected pin by loading enabling bits into the boundary scan cell of the selected pin;
measuring the capacitance of said selected pin via the access pins;
determining the capacitance of the selected pin by subtracting the effects of the capacitance of the bus to obtain said measured capacitance; and said comparing the value including comparing the measured value to the capacitance value expected for said selected pin if it were unconnected to deduce whether a wire is connected to said selected pin or how much wire is connected to the pin.

2. A method as defined in claim 1, further including calculating said expected IC pin capacitance using an expected capacitance of the pin without any printed wire capacitance connected to the pin and an expected capacitance per unit length of the printed circuit wire.

3. A method for testing an integrated circuit (IC) for open defects in a printed wire intended to connect two IC pins on the same or different ICs, the method comprising:

measuring the capacitance between the IC pin and ground;

comparing the value of the measured capacitance to an expected IC pin capacitance value between the pin and ground with the pin unconnected, and determining that an open defect exists proximate the pin when the measured capacitance is less than a predetermined value based on said expected IC pin capacitance;

said step of measuring including:
measuring the capacitance of each of the two IC pins;
determining a length of printed wire connected to each IC pin based on an expected capacitance of the pin without any printed wire capacitance connected to the pin and an expected capacitance per unit length of the printed circuit wire; and
determining the location of an open circuit defect in the printed wire to be closer to the pin calculated to have the shortest length of printed wire connected to it.

4. A method as defined in claim 1, said step of measuring the capacitance including applying a stimulus signal to the pin connected to the wire via a digitally controlled electrical access and detecting a resultant signal at the pin via the digitally controlled electrical access.

5. A method for testing an integrated circuit (IC) for open defects in a printed wire connected to two IC pins, comprising:

measuring the capacitance between each of the two IC pins and ground by applying a stimulus signal to the pins connected to the wire via digitally controlled electrical access and detecting a resultant signal at each pin via the digitally controlled electrical access;

comparing the value of the measured capacitance of each pin to respective expected IC pin capacitance value between the pin and ground with the pin unconnected; and determining that an open defect exists closer to one of said pins than the other of said pins based on a length of wire from each pin determined by using the measured capacitance and expected capacitance per unit length of the wire.

* * * * *